(12) United States Patent
Kenefic et al.

(10) Patent No.: US 8,606,838 B1
(45) Date of Patent: Dec. 10, 2013

(54) METHOD AND APPARATUS FOR CONFIGURABLE SAMPLE RATE CONVERSION IN TELEOPERATED DEVICES

(75) Inventors: Richard J. Kenefic, Fort Wayne, IN (US); David W. Shin, Fort Wayne, IN (US); Saad Karim, Cary, NC (US)

(73) Assignee: Raytheon Company, Waltham, MA (US)

( * ) Notice: Subject to any disclaimer, the term of this patent is extended or adjusted under 35 U.S.C. 154(b) by 536 days.

(21) Appl. No.: 12/943,228

(22) Filed: Nov. 10, 2010

(51) Int. Cl.
*G06F 17/10* (2006.01)

(52) U.S. Cl.
USPC .......................................................... 708/313

(58) Field of Classification Search
None
See application file for complete search history.

(56) References Cited

U.S. PATENT DOCUMENTS

| | | | |
|---|---|---|---|
| 6,462,682 B2 * | 10/2002 | Hellberg | 341/61 |
| 6,766,338 B1 | 7/2004 | Handley et al. | |
| 7,477,323 B2 * | 1/2009 | Chou | 348/581 |
| 7,908,306 B1 * | 3/2011 | Chieng et al. | 708/300 |
| 2001/0037351 A1 * | 11/2001 | Hellberg | 708/313 |
| 2004/0148319 A1 | 7/2004 | Bossmeyer et al. | |
| 2004/0184573 A1 * | 9/2004 | Andersen et al. | 375/372 |
| 2008/0147761 A1 * | 6/2008 | Melanson | 708/313 |

OTHER PUBLICATIONS

Crochiere et al; "Interpolation and Decimation of Digital Signals—A Tutorial Review;" Proceedings of the IEE; vol. 69, No. 3, Mar. 1981; pp. 300-331.
Crochiere et al.; "Multirate Processing of Digital Signals;" Advanced Topics in Signal Processing; Prentice-Hall, 1988; pp. 123-198.
Ramstad; "Digital Methods for Conversion Between Arbitrary Sampling Frequencies;" IEEE Transactions on Acoustics, Speech, and Signal Processing; vol. ASSP-32, No. 3; Jun. 1984; pp. 577-591.
Schafer et al.; "A Digital Signal Processing Approach to Interpolation;" Proceedings of the IEEE, vol. 61, No. 6; Jun. 1973; pp. 692-702.
Lim, Jae S. and Oppenheim, Alan V. (eds); Advanced Topics in Signal Processing, "Multirate Processing of Digital Signals;" Ronald E. Crochiere and Lawrence R. Rabiner; pp. 123-198; Prentice-Hall; 1988.

* cited by examiner

*Primary Examiner* — David H Malzahn
(74) *Attorney, Agent, or Firm* — Daly, Crowley, Mofford & Durkee, LLP (57) ABSTRACT

Disclosed is an efficient and configurable apparatus and method for sample rate conversion using interpolation. The apparatus and method employ a configuration file to change the conversion coefficients, sampling rate, and interpolation algorithm without having to recompile control software and/or reprogram the controlled device. In some embodiments, the interpolation employs polynomial interpolation, which may include Lagrange interpolation. In some embodiments, the interpolation method is selected to minimize the loop delay in teleoperation applications.

24 Claims, 12 Drawing Sheets

METHOD AND APPARATUS FOR CONFIGURABLE SAMPLE RATE CONVERSION IN TELEOPERATED DEVICES

GOVERNMENT SUPPORT NOTICE

This invention was made with government support under Contract No. W56HZV-05-C-0724 and Subcontract No. 5EC8377H, awarded by the U.S. Army. The government has certain rights in the invention.

COPYRIGHT NOTICE

Portions of the disclosure of this patent document contain material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Figure 1:
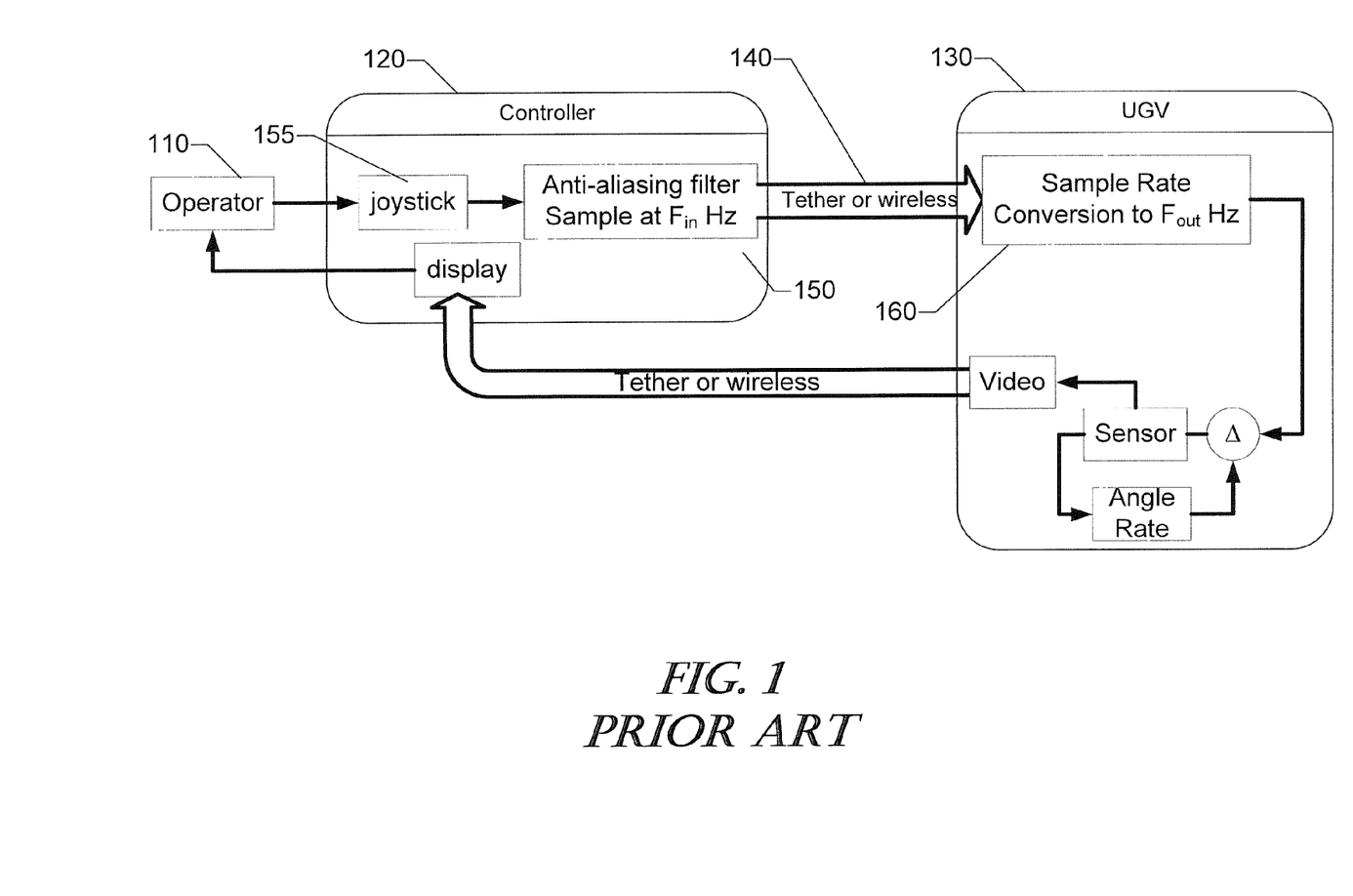
FIG. 1 is a block diagram of a prior art sample rate conversion (SRC) system.

In remote teleoperation of unmanned ground vehicles (UGVs), an operator uses a joystick to point sensors and steer the vehicle. Commands from these joysticks and other control devices are communicated to the UGV via radio waves or other systems generally known in the art. These control signals are received by the UGV and used to control the UGV and/or its sensors and payloads, generally referred to herein as "onboard subsystems." Very often the onboard subsystem sampling rates required are greater than the sample rates that can be sent over a data link, and it is therefore necessary to perform a sample rate conversion. One typical application of sample rate conversion (SRC) may be performed (for example) onboard the UGV, as shown in FIG. 1. Operator 110 uses controller 120 to control UGV 130 via a wired tether or other means 140, including wireless communications systems known to one of ordinary skill in the art. Anti-aliasing filter 150 samples joystick 155 data at a sample rate of $F_{in}$ and communicates the position input data to UGV 130 over link 140. Sample rate $F_{in}$ is up-converted to the UGV's required sample rate $F_{out}$ in converter 160 to control the onboard subsystems.

Sample rate conversions (SRC) of this sort are well known, as (for example) described in Schafer (Ronald W. Schafer and Lawrence R. Rabiner, "A Digital Signal Processing Approach to Interpolation," Proceedings of the IEEE, vol. 61, no. 6, June 1973, pp. 692-702). Schafer considered the case of two-point linear interpolation and showed that the digital FIR implementation of the SRC has a triangular impulse response. Schafer also considered the general Lagrange interpolator and noted that for odd degree the filter was not linear phase. The Schafer reference, however, did not present a compact and configurable implementation for any of general Lagrange interpolations. Similarly, Ramstad (Tor A. Ramstad, "Digital Methods for Conversion Between Arbitrary Sampling Frequencies," IEEE Transactions on Acoustics, Speech, and Signal Processing, vol. ASSP-32, no. 3, June 1984, pp. 577-591 has noted that when the SRC rate is rational, the coefficients required are periodic and can be precomputed. But this paper does not present any method for the generation of the coefficients.

In most cases of sample rate conversion, the group delay of the filter is less important than signal fidelity. However, in remote teleoperation it is desirable to keep the loop delay to a minimum to insure that the vehicle remains controllable, and the SRC filter group delay should also be made as small as possible.

One problem seen in the prior art is that as sensors and payloads change and evolve, different sample rate conversions are required. Not only do the input sample rates change as controllers evolve, but the requirements on $F_{out}$ vary widely as different sensors or other payloads are incorporated on the UGV. Currently, the control software on the UGV is implemented monolithically as dedicated block of code including the SRC computation algorithms. SRC parameters are typically hard coded into the software. This necessitates re-writing and re-compiling the controller code every time the SRC needs to be changed. What is needed is a rapidly reconfigurable sample rate conversion method that allows rapid changes to the SRC parameters without requiring recompiling the control software.

SUMMARY

Presently described is a configurable architecture for a variable parameter sample rate conversion (SRC) system that allows for easy and rapid re-parameterization of the interpolation algorithms without requiring software recompilation. This architecture allows the system operators to reconfigure payload and onboard sensor subsystems of a remote device, such as an unmanned ground vehicle (UGV) or other teleoperated device, without having to re-write and recompile any control software. Changes to the SRC parameters, even to the point of selecting different-order Lagrange interpolations, may be accomplished solely by commanding the use of one of a plurality of pre-defined configuration files stored in the remote device.

Architectures constructed according to the systems, methods, and principles of this disclosure can change the relative sample rate ratio and/or the interpolation algorithms by choosing from among a plurality of pre-defined configuration files. A control program operating on and in a controller reads the parameters particular to the subsystem of interest from the configuration file and uses them to interpolate the output samples. The interpolation is performed according to the selected Lagrange algorithm (or method) on each sample.

In some embodiments, when an onboard sensor or other subsystem is changed or adjusted, the operators need only generate a new configuration file from the desired sample rate parameters (i.e., the input and output sample rates and the interpolation algorithm appropriate to the onboard subsystem and data rates) and upload it to the remote device's onboard controller. Since the algorithms for generating the configuration file are designed to minimize the group delay for the given sample rate ratio, this architecture provides a flexible and reconfigurable solution for the SRC problem without having to recompile the control software on the remote device.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

In this disclosure, we present an efficient and easily configurable method for sample rate conversion (SRC) using Lagrange interpolation algorithms for arbitrary rational sample rate ratios where the group delay is maintained as small as possible. In some representative embodiments, the SRC is accomplished using data stored in one or more of a plurality of candidate configuration files, where different configuration files may be used to provide SRC at different $F_{out}/F_{in}$ ratios and using different interpolation algorithms. (The ratio $F_{out}/F_{in}$ is also referred to herein as the conversion rate.) In other embodiments, a single file with multiple sections (each comprising the filter or interpolation coefficients needed for a particular interpolation algorithm and conversion ratio) may be used.

Such configuration files may contain the interpolation or filter coefficients and the interpolation algorithm to apply for each sample rate conversion ratio needed. Hence, any change in $F_{in}$ or $F_{out}$ can be accommodated by changing the configuration file. Similarly, any change in the anti-imaging performance required by the SRC can also be realized by changing the configuration file. The fractional rate interpolation algorithms considered herein include a sample and hold, two-point linear interpolation (i.e. $1^{st}$ order Lagrange), and parabolic (i.e. $2^{nd}$ order Lagrange) interpolation, but the method is easily extended to any higher order Lagrange interpolator. Accordingly, although specific interpolators and interpolation algorithms are described, those skilled in the art will realize that interpolators and/or interpolation algorithms other than sample and hold, two-point linear, or higher order Lagrange-type methods can also be used. Accordingly, the concepts, systems, and techniques described herein are not limited to use with any particular type of interpolator.

Embodiments of the present apparatus and method are directed to techniques for SRC that reduce or in some cases even minimize group delay in associated filters while permitting rapid selection of alternate sample rates and/or interpolation algorithms using pre-determined configuration data files stored in a memory. Using an interpolation factor L and a decimation factor M as parameters and an operator-selected Lagrange interpolation appropriate to the application, this architecture provides for embodiments that can generate configuration files containing key lookup parameters for use in the rapid interpolation of output samples.

As noted above, in most SRC implementations, filter group delay is less important than signal fidelity. However, in remote teleoperation in particular, the loop delay between an operator/controller and an unmanned ground vehicle (UGV) should be minimized to insure that the vehicle remains controllable, and in these situations, the SRC filter group delay should be made as small as possible. The factors are determined in part by the types of sensors or payloads being commanded, the input control devices, and the type of interpolation algorithm selected. The sample image rejection needed by the operator also affects these choices, but the proper calculation of the configuration parameters used by the below-described architecture ensures that group delay is kept as small as possible.

Figure 2:
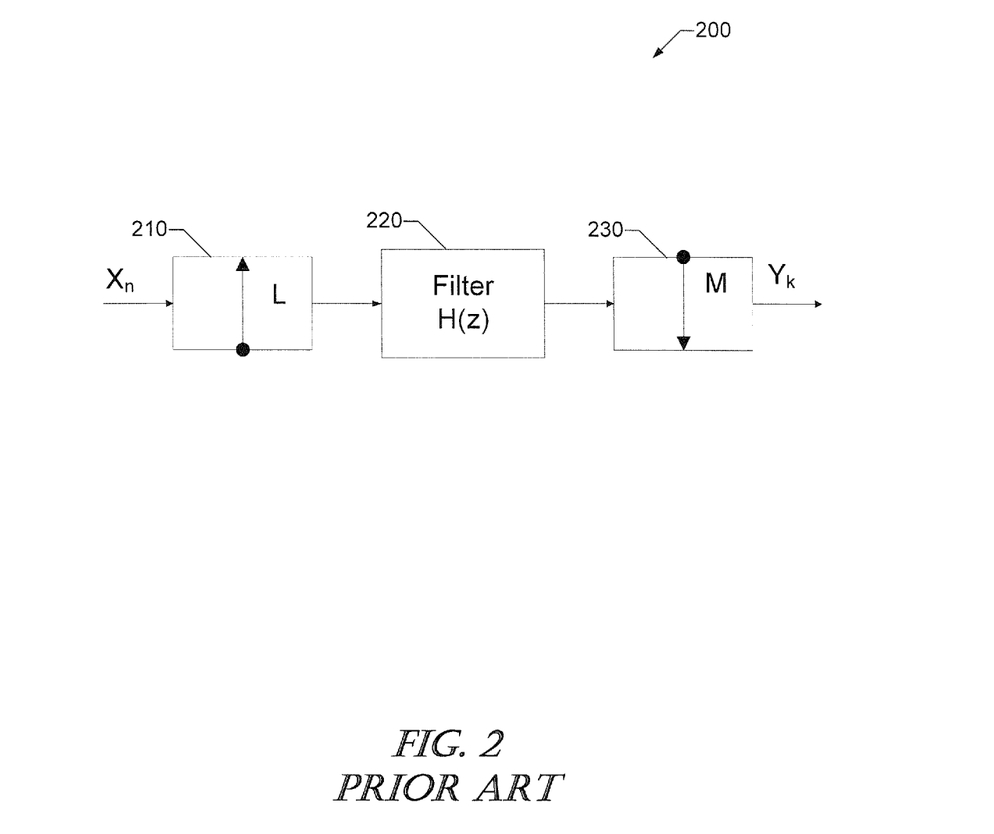
FIG. 2 is a block diagram of a prior art fractional rate SRC.

To illustrate a typical implementation of sample rate conversion (as, for example but not by way of limitation, in a UGV application), consider a general sample rate conversion (SRC) where the input and output rates are not related by an integer. When the input $X_N$ sample rate is 50 Hz and the required output sample rate is 120 Hz, the fractional conversion rate is L/M=12/5. Referring to FIG. 2, such an SRC may be implemented with system 200. System 200 consists of up-sampler 210 operating at integer rate L. The up-sampled signal is filtered by filter 220 (for example, a FIR filter). The filtered output is then down-sampled at integer rate M by decimator 230 to produce output signal $Y_k$.

An efficient and configurable SRC implementation is described below for three types of Lagrange interpolations: sample and hold, two-point linear interpolation, and quadratic interpolation. In each case considered below, it is shown that the group delay of the SRC filter is equal to one-half the input sample period.

Figure 3:
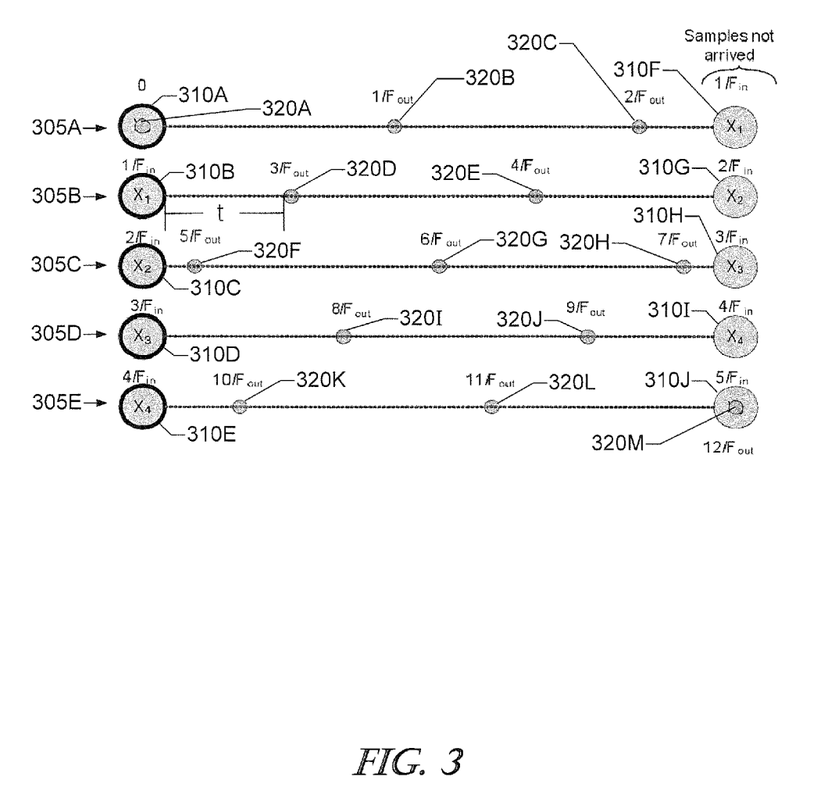
FIG. 3 is an interpolation timing diagram for a sample and hold interpolation algorithm, according to one embodiment of the present invention.

The sample and hold interpolation algorithm holds and repeats the most recent input sample to obtain the higher output sample rate. Referring to FIG. 3, for input sample rate $F_{in}$ and output sample rate $F_{out}$, it is possible to calculate the times at which each input sample must be repeated. FIG. 3 represents the input and output sample timing by slicing time (the horizontal axis) into frames 305A through 305E. Circles 310A, 310B, . . . , 310E represent input samples, i.e., the command signals from the controller arriving at rate $F_{in}$. Circles 320A, 320B, . . . , 320M represent output samples that are sent to the sensor/payload at rate $F_{out}$. Note that the most recent input sample 310 is used repeatedly, until a new input sample arrives. So, for example, input sample 310A is sent out (320A) at time zero, time $1/F_{out}$ (320B), and time $2/F_{out}$ (320C); input sample 310B ($X_1$) at time $3/F_{out}$ (320D) and time $4/F_{out}$ (320E); and sample 310C goes at time $5/F_{out}$ (320F), time $6/F_{out}$ (320G), and time $7/F_{out}$ (320H), and so on. At time 5/Fin, the pattern repeats, since this is an example of sample conversion rate of 12/5; output sample 320M is therefore the first sample of the next five frames.

In each frame, the next input sample (e.g., 310F, 310G, . . . 310J on the far right of each row) has not yet arrived.

The time t in FIG. 3 between the current input sample and the output sample in the $n^{th}$ frame is given by:

$$t = \frac{m-1}{F_{out}} - \frac{n}{F_{in}}$$

as shown in Table 1 for $F_{in}$=50 Hz and $F_{out}$=120 Hz, where m is the output frame index and n is the input frame index.

TABLE 1

Lookup table for sample and hold
output times for rate 12/5 SRC.

| m | n | t (sec) |
|---|---|---|
| 1 | 0 | 0.000000 |
| 2 | 0 | 0.008333 |
| 3 | 0 | 0.016667 |
| 4 | 1 | 0.005000 |
| 5 | 1 | 0.013333 |
| 6 | 2 | 0.001667 |
| 7 | 2 | 0.010000 |
| 8 | 2 | 0.018333 |
| 9 | 3 | 0.006667 |
| 10 | 3 | 0.015000 |
| 11 | 4 | 0.003333 |
| 12 | 4 | 0.011667 |

The m and n values from this lookup table may then be incorporated in a configuration file used to produce an output sequence of samples at the desired output rate from input samples with the sample and hold method. In one exemplary embodiment, only the n column is included in the configuration file because the m column is functioning as a counter. Thus the configuration file contains at least column n and an identifier of the interpolation algorithm. For sample and hold, the interpolation coefficients are all equal to unity because the sample is being held and not modified.

The software code of Table 2 is an exemplar MATLAB implementation for performing sample and hold interpolation SRC at a rate ratio of 12/5. The values for TOUT are generated based on the output sample rate.

Although a software implementation of this method (and other variations, discussed below) is described in MATLAB, those skilled in the art will realize that other implementations, in other software languages and in hardware, software, or a combination thereof can also be used. Accordingly, the concepts, systems, and techniques described herein are not limited to any particular software language or even to a software-only implementation.

TABLE 2

MATLAB implementation of rate 12/5
SRC for sample and hold interpolation

```
%-- copyright © 2010 Raytheon Company
tout = 1/Fout;
L = 12;
M = 5;
k = 1;
for n=0:length(yin)-1
  if n>0,
    nn = mod(n-1,M);
    out = [ ];
    while (k<=L)&(config(k,1)==nn)
      x0 = yin(n);
      YOUT = [YOUT x0];
      dum = TOUT(end);
      TOUT = [TOUT dum+tout];
      k = k + 1;
    end
    if k==L+1, k = 1; end
  end
end
```

Figure 4:
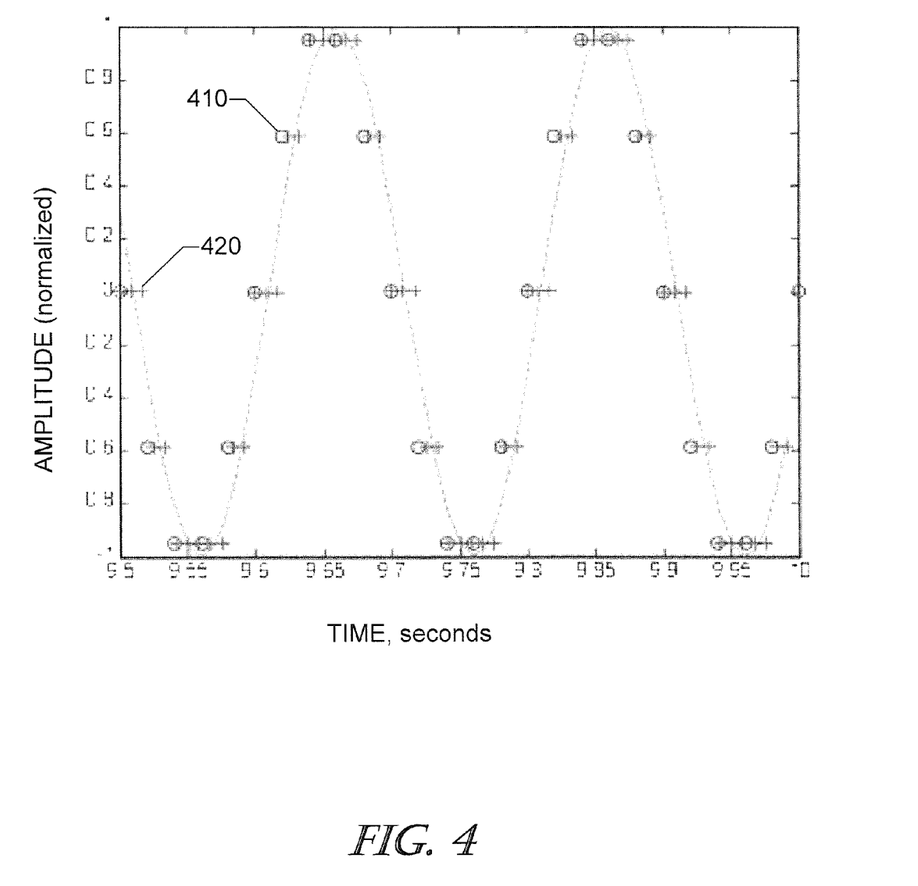
FIG. 4 is plot of a 5 Hz control signal showing input samples at 50 Hz (circles) and output samples at 120 Hz (crosses) for a sample and hold interpolator operating at rate 12/5 SRC, according to one embodiment of the present invention.

The sample and hold interpolation output is shown in FIG. 4 for an exemplar 5 Hz control signal (solid curve). The input sample rate is 50 Hz; the input samples are represented by circles 410. The output sample rate is 120 Hz; crosses 420 represent the output samples. Although a particular control signal and sampling rates are described, those skilled in the art will realize that various sampling rates and representative control signals other than those illustrated may be used. Accordingly, the concepts, systems, and techniques described herein are not limited to any particular control signal, input, and/or output sample rates. (For clarity in the drawing, not all output samples are visible because all samples within each frame have the same magnitude.)

Figure 5:
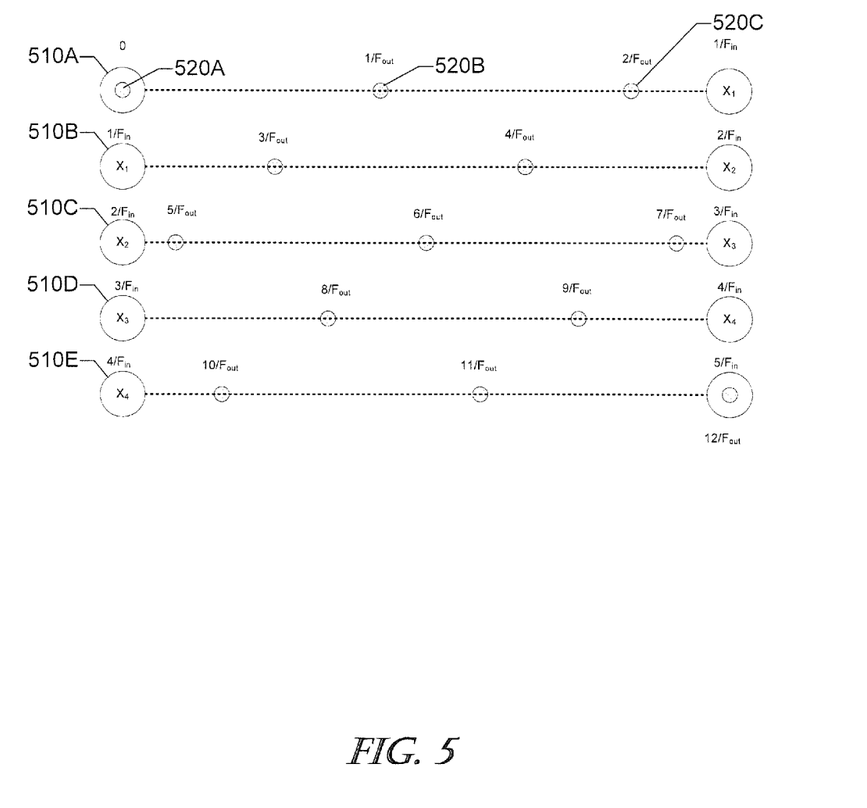
FIG. 5 is an interpolation timing diagram for a two-point linear interpolation algorithm for the case when L=12 and M=5, according to one embodiment of the present invention.

In the two-point linear interpolation algorithm, one needs to consider an input sample rate $F_{in}$ and an output sample rate $F_{out}$ such that $$\frac{F_{out}}{F_{in}} = \frac{L}{M}$$

such that L and M are relatively prime integers. It follows that $$\frac{L}{F_{out}} = \frac{M}{F_{in}}$$

and the $M^{th}$ input sample occurs at the same time as the $L^{th}$ output sample. This is shown in FIG. 5 for two-point linear interpolation where the circles 510A, 510B, ..., 510E represent input samples and circles 520A, 520B, 520C, etc., represent output samples. In general, there will be M frames in two-point linear interpolation and L rows in the interpolation table.

To see how many rows in the interpolation table are generated in each frame, note that we are looking for the indices l such that $$\frac{m-1}{F_{in}} \le \frac{l}{F_{out}} < \frac{m}{F_{in}}$$

in frame m. From this relation it follows that $$\frac{L(m-1)}{M} \le l < \frac{Lm}{M}$$

from which $$l = \text{ceil}\left(\frac{L(m-1)}{M}\right), L, \text{floor}\left(\frac{Lm}{M}\right)$$

where ceil(x) is the nearest integer greater than or equal to x and floor(x) is the nearest integer less than or equal to x. The interpolated output sample is given by $$y_l = aX_m + bX_{m+1}$$

where l is the output sample index and m is the input frame index. To determine the coefficients a and b in the interpolation table for row l in frame m note that, by similar triangles, $$\frac{y_l - X_{m-1}}{X_m - X_{m-1}} = \frac{\frac{l}{F_{out}} - \frac{m-1}{F_{in}}}{\frac{1}{F_{in}}}$$

from which $$y_l = \left[1 - \left(\frac{Ml}{L} - (m-1)\right)\right]X_{m-1} + \left[\frac{Ml}{L} - (m-1)\right]X_m.$$

Hence, $$b = \left[\frac{Ml}{L} - (m-1)\right]$$

and a=1−b. Note that the indexing on l starts at 0.

An exemplar MATLAB script to generate a configuration file (also referred to herein as a lookup table) for two-point linear interpolation is shown in Table 3. Examples of the output parameters a and b (the interpolation coefficients) for various SRC rate conversions are shown in Tables 4, 5, and 6. Note that the exemplar code for generating the configuration files in all cases (see, e.g., MATLAB scripts in Tables 3 and 8) is designed to minimize the group delay by interpolating the output samples between the two most recent input samples, resulting in a group delay equal to half of the input sample rate.

TABLE 3

MATLAB script to generate lookup tables for
two-point linear interpolation

```
%-- copyright © 2010 Raytheon Company
%-- generate config file for rate L/M
%-- there are L rows and M "frames" where a "frame" consists of
%-- all the output samples bracketed by 2 adjacent input samples
L = 8;
M = 3;
for m=1:M %--loop on frame number
  upper = floor(L*m/M);
  if upper==(L*m/M), upper = upper-1; end
  for l=ceil(L*(m-1)/M):upper
    b = (M*l/L)-m+1;
    a = 1-b;
    if l<L, fprintf(1, ' %d\t%f\t%f\t%d\n',l+1,m-1,a,b); end
  end
end
```

TABLE 4

Example for rate 12/5 (50 Hz to 120 Hz)

| m | n | a | b |
|---|---|---|---|
| 1 | 0 | 1.000000 | 0.000000 |
| 2 | 0 | 0.583333 | 0.416667 |
| 3 | 0 | 0.166667 | 0.833333 |
| 4 | 1 | 0.750000 | 0.250000 |
| 5 | 1 | 0.333333 | 0.666667 |
| 6 | 2 | 0.916667 | 0.083333 |
| 7 | 2 | 0.500000 | 0.500000 |
| 8 | 2 | 0.083333 | 0.916667 |
| 9 | 3 | 0.666667 | 0.333333 |
| 10 | 3 | 0.250000 | 0.750000 |
| 11 | 4 | 0.833333 | 0.166667 |
| 12 | 4 | 0.416667 | 0.583333 |

TABLE 5

Example for rate 3/1 (40 Hz to 120 Hz)

| m | n | a | b |
|---|---|---|---|
| 1 | 0 | 1.000000 | 0.000000 |
| 2 | 0 | 0.666667 | 0.333333 |
| 3 | 0 | 0.333333 | 0.666667 |

TABLE 6

Example for rate 8/3 (45 Hz to 120 Hz)

| m | n | a | b |
|---|---|---|---|
| 1 | 0 | 1.000000 | 0.000000 |
| 2 | 0 | 0.625000 | 0.375000 |
| 3 | 0 | 0.250000 | 0.750000 |
| 4 | 1 | 0.875000 | 0.125000 |
| 5 | 1 | 0.500000 | 0.500000 |
| 6 | 1 | 0.125000 | 0.875000 |
| 7 | 2 | 0.750000 | 0.250000 |
| 8 | 2 | 0.375000 | 0.625000 |

An exemplar MATLAB code fragment that generates the output sequence from the input samples is shown in Table 7 where the "config" array consists of the "a," "b," and "n" columns in the lookup tables.

TABLE 7

MATLAB implementation of rate L/M SRC
for two-point linear interpolation.

```
%-- copyright © 2010 Raytheon Company
tout = 1/Fout;
k = 1;
for n=0:length(yin)-1
  if n>0,
    nn = mod(n-1,M);
    out = [ ];
    while (k<=L)&(config(k,1)==nn)
      a = config(k,2); b = config(k,3);
      x0 = yin(n); x1 = yin(n+1);
      YOUT = [YOUT a*x0+b*x1];
      dum = TOUT (end);
      TOUT = [TOUT dum+tout];
      k = k + 1;
    end
    if k==L+1, k = 1; end
  end
end
```

Figure 6:
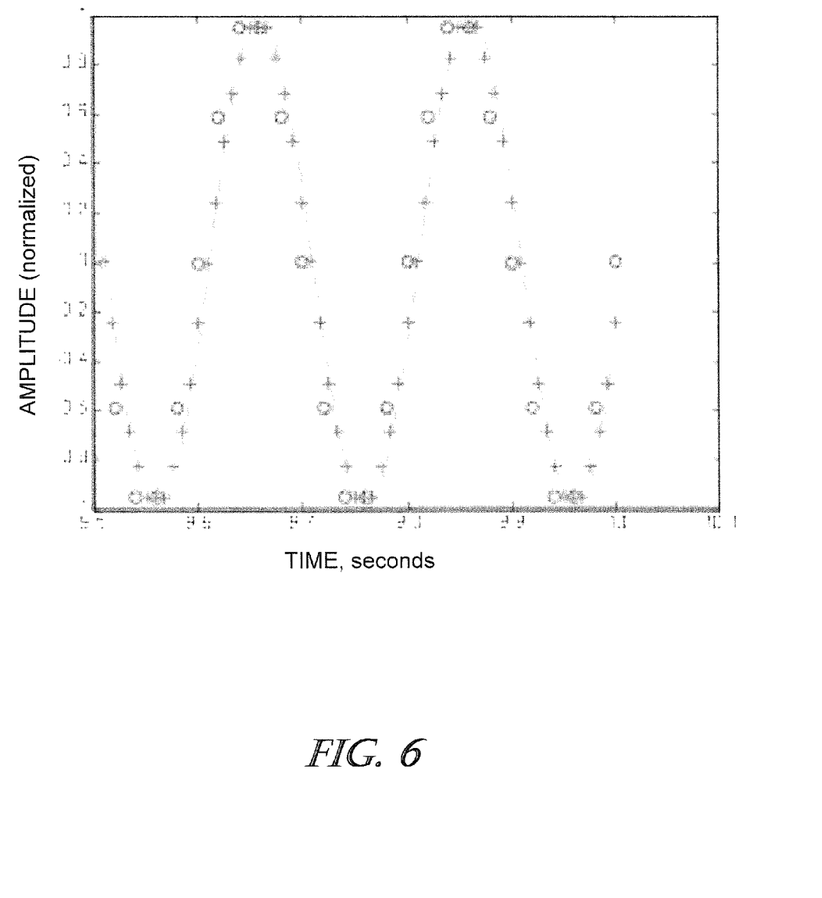
FIG. 6 is a plot of a 5 Hz control signal showing input samples at 50 Hz (circles) and output samples at 120 Hz (crosses) for two-point linear interpolation in a rate 12/5 SRC, according to one embodiment of the present invention.

Note that the implementation presented in FIG. 6 for two-point linear interpolation is easily generalized for the sample and hold or parabolic interpolation by adjusting the number of coefficient columns. An example of this table for the sample and hold is given in Table 1. An example input and output of the two-point linear interpolation SRC implementation is shown in FIG. 6.

Figure 7:
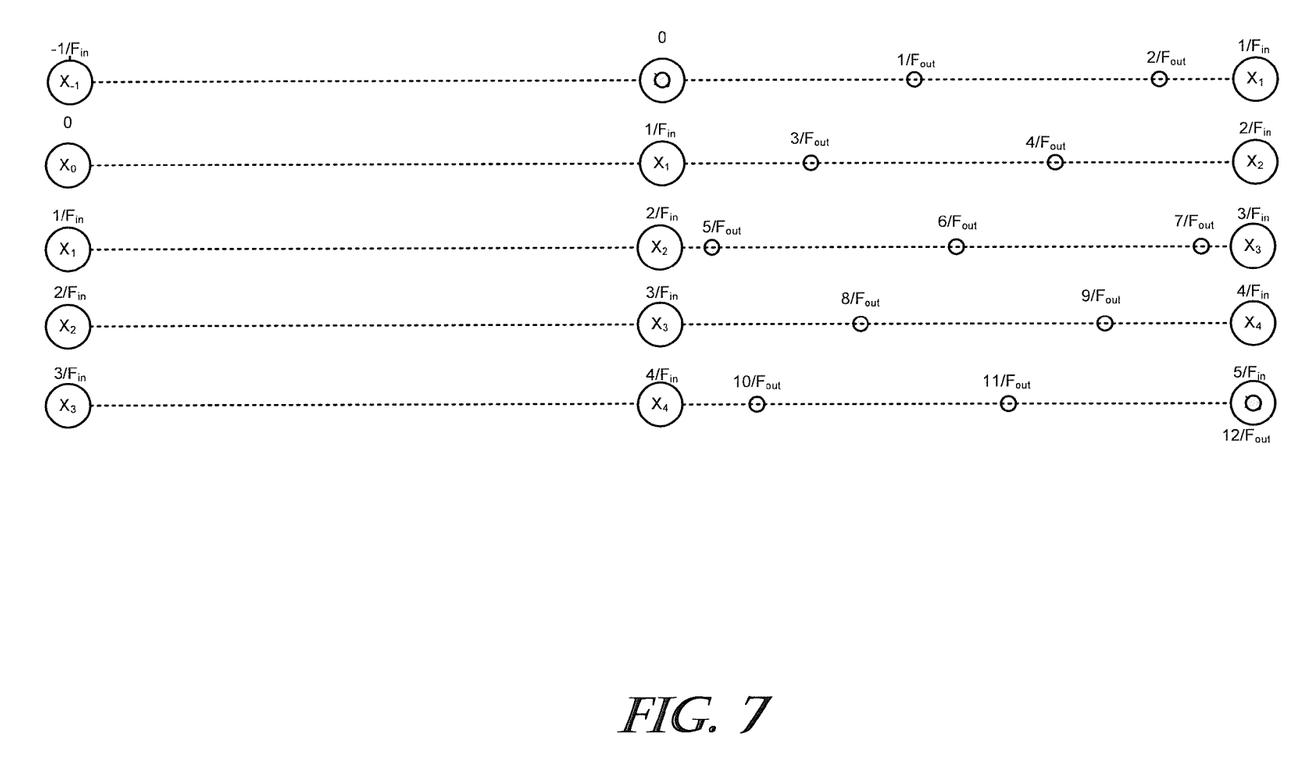
FIG. 7 is an interpolation timing diagram for a quadratic interpolation algorithm for the case when L=12 and M=5, according to one embodiment of the present invention.

In the quadratic interpolation algorithm, the most recent three samples are fit to a quadratic, and the output samples that lie between the most recent two samples are obtained from this fit, as shown in FIG. 7.

Consequently, the output sample times used for the sample and hold or the two-point linear interpolation cases are unchanged. Making use of the $2^{nd}$ order Lagrange interpolator described by Schafer and Rabiner (cited above) and Hamming (R. W. Hamming, *Numerical Methods for Scientists and Engineers*, New York, McGraw-Hill, 1962, p. 235, (incorporated herein by reference in its entirety), the $l^{th}$ output sample is given by $$y_l = aX_{m-1} + bX_m + cX_{m+1}$$

where l is the output sample index, m is the input frame index, and $$a = d(d-1)/2$$

$$b = -(d+1)(d-1)$$

-continued $$c = d(d+1)/2$$

$$d = \left(\frac{Ml}{L}\right) - m$$

An exemplar MATLAB script to generate the configuration table for the quadratic interpolation algorithm is shown in Table 8. An example of the output for a rate 12/5 SRC is given in Table 9.

TABLE 8

MATLAB script to generate lookup tables for quadratic interpolation

```
%-- copyright © 2010 Raytheon Company
%-- generate quadratic interpolation config file for rate L/M
%-- there are L rows and M "frames"
%-- where a "frame" consists of all the output samples
%-- bracketed by 2 adjacent input samples
L = 12;
M = 5;
for m=1:M %--loop on frame number
    mm = m−1;
    upper = floor(L*m/M);
    if upper==(L*m/M), upper = upper−1; end
    for l=ceil(L*(m−1)/M):upper
        d = (M*l/L)−mm;
        a = d*(d−1)/2;
        b = −(d+1)*(d−1);
        c = d*(d+1)/2;
        if l<L, fprintf(1, ' %d\t%f\t%f\t%f\t%d\n',l+1,mm,a,b,c); end
    end
end
```

TABLE 9

Example for rate 12/5 (50 Hz to 120 Hz)

| m | n | a | b | c |
|---|---|---|---|---|
| 1 | 0 | −0.000000 | 1.000000 | 0.000000 |
| 2 | 0 | −0.121528 | 0.826389 | 0.295139 |
| 3 | 0 | −0.069444 | 0.305556 | 0.763889 |
| 4 | 1 | −0.093750 | 0.937500 | 0.156250 |
| 5 | 1 | −0.111111 | 0.555556 | 0.555556 |
| 6 | 2 | −0.038194 | 0.993056 | 0.045139 |
| 7 | 2 | −0.125000 | 0.750000 | 0.375000 |
| 8 | 2 | −0.038194 | 0.159722 | 0.878472 |
| 9 | 3 | −0.111111 | 0.888889 | 0.222222 |
| 10 | 3 | −0.093750 | 0.437500 | 0.656250 |
| 11 | 4 | −0.069444 | 0.972222 | 0.097222 |
| 12 | 4 | −0.121528 | 0.659722 | 0.461806 |

An exemplar of the MATLAB code that generates the quadratic interpolation from the configuration table is shown in Table 10. Note that the code structures in Tables 10, 7, and 2 are the same. The difference between them is the calculation of the output sample within the "While" loop. Hence, the same code may be used for any of the interpolation algorithms considered where the method to be applied is selected within the "While" loop by a configuration file parameter.

TABLE 10

MATLAB implementation of rate L/M SRC for quadratic interpolation.

```
%-- copyright © 2010 Raytheon Company
tout = 1/Fout;
k = 1;
for n=0:length(yin)−1
    if n>1,
        nn = mod(n−2,M);
        while (k<=L)&(config(k,1)==nn)
            a = config(k,2); b = config(k,3); c = config(k,4);
            xm1 = yin(n−1); x0 = yin(n); xp1 = yin(n+1);
            YOUT = [YOUT a*xm1+b*x0+c*xp1];
            dum = TOUT(end);
            TOUT = [TOUT dum+tout];
            k = k + 1;
        end
        if k==L+1, k = 1; end
    end
end
```

Figure 8:
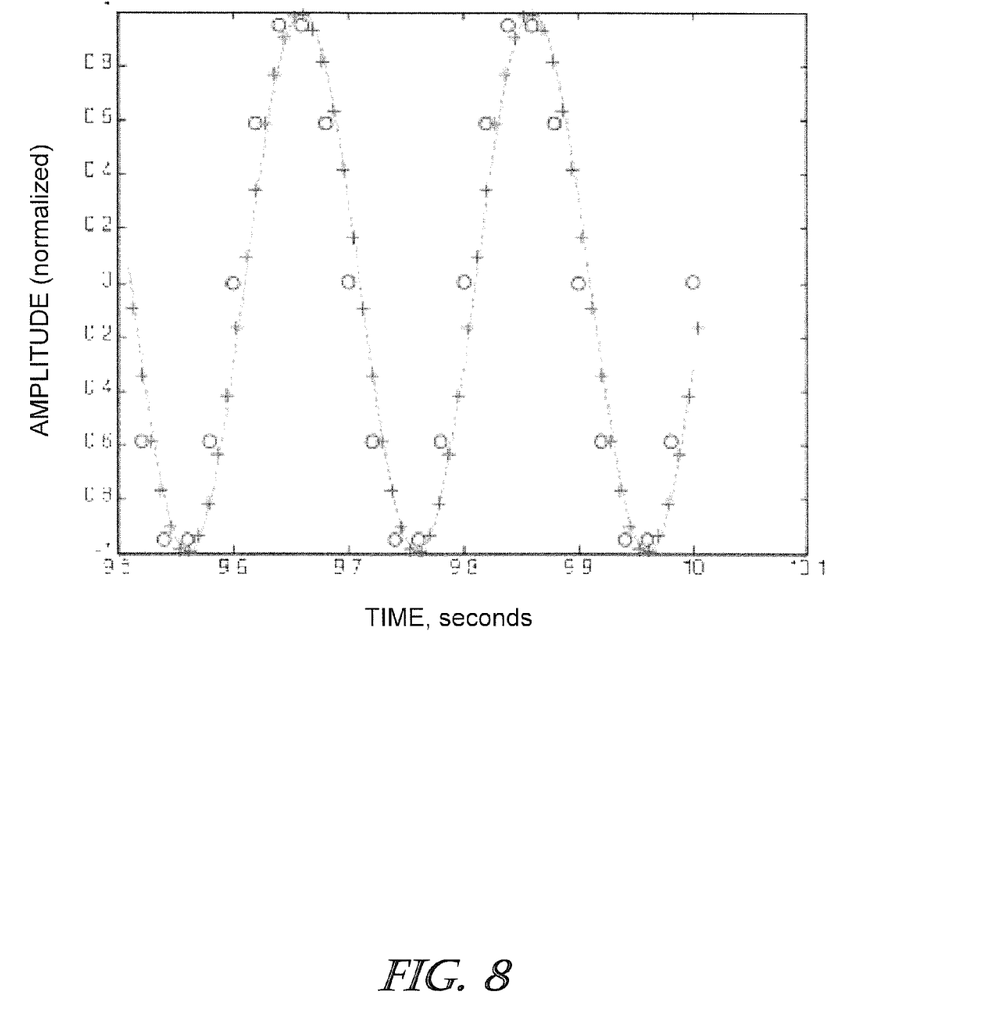
FIG. 8 is a plot of a 5 Hz control signal showing input samples at 50 Hz (circles) and output samples at 120 Hz (crosses) for quadratic interpolation in a rate 12/5 SRC, according to one embodiment of the present invention.

An example input and output of the quadratic interpolation SRC implementation is shown in FIG. 8.

Figure 9:
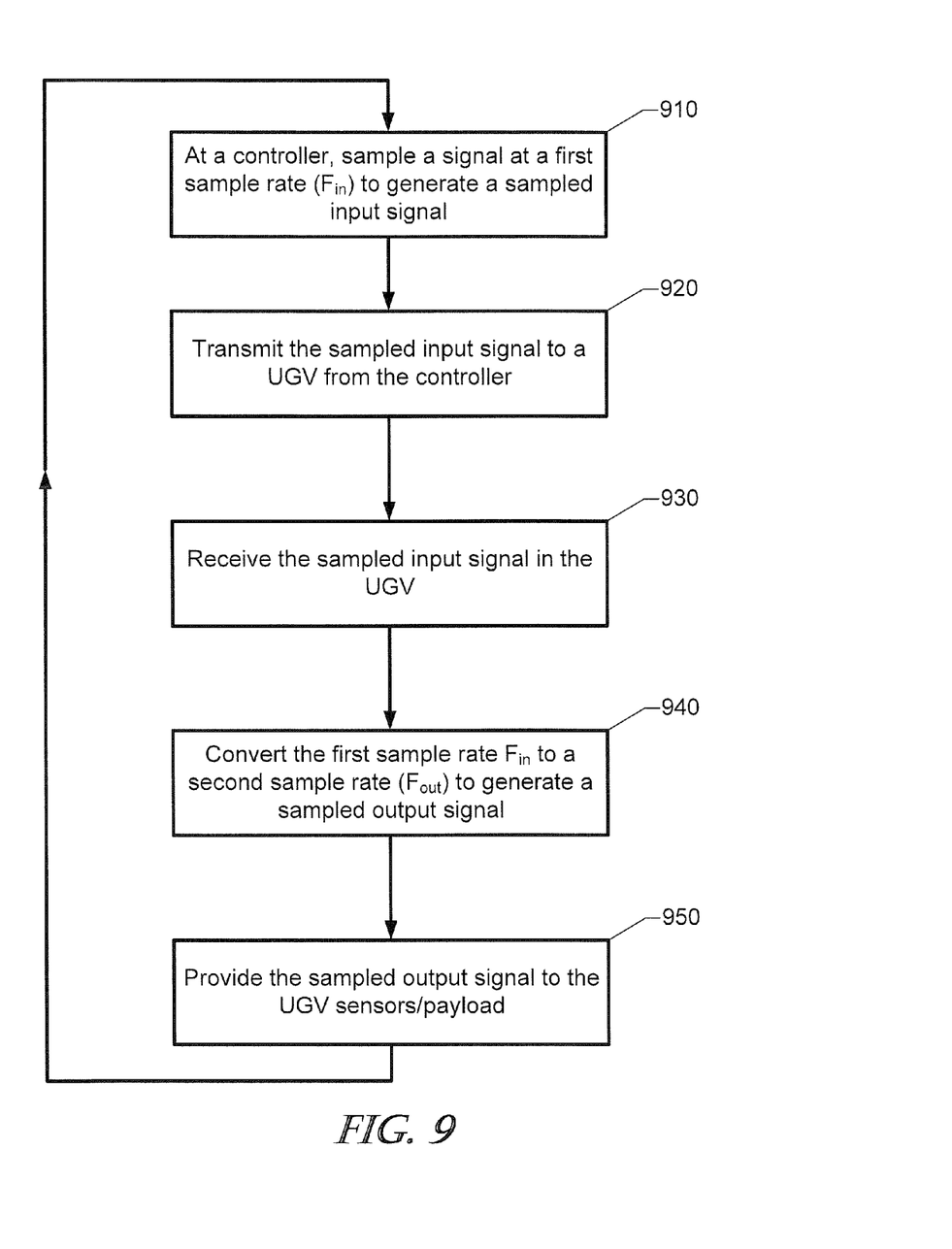
FIG. 9 is a flowchart of a high-level SRC process according to one embodiment of the present invention.

The process by which configuration files are generated and then employed to change the SRC method as sensors and/or payloads are changed is illustrated in FIG. 9. In some embodiments, the present system is employed in the remote operation of a device, such as an unmanned ground vehicle (UGV). For each control operation, such as commanding a turn, a control signal is generated in the remote controller. In step 910, that control signal is sampled, generating an input signal at a first sample rate. The input signal is then transmitted, step 920, to the UGV.

The input signal is received by the UGV in step 930. The onboard controller of the UGV then converts the input signal at the first sample rate to the output signal at a second sample rate in step 940. (This step is further detailed below.) The UGV onboard controller then distributes the output signal to the actuator affected, in this example the steering subsystem, in step 950. In general, and without limiting the scope of the present disclosure, the sampled output sample is sent to whichever sensor or payload is being commanded remotely.

Figure 10:
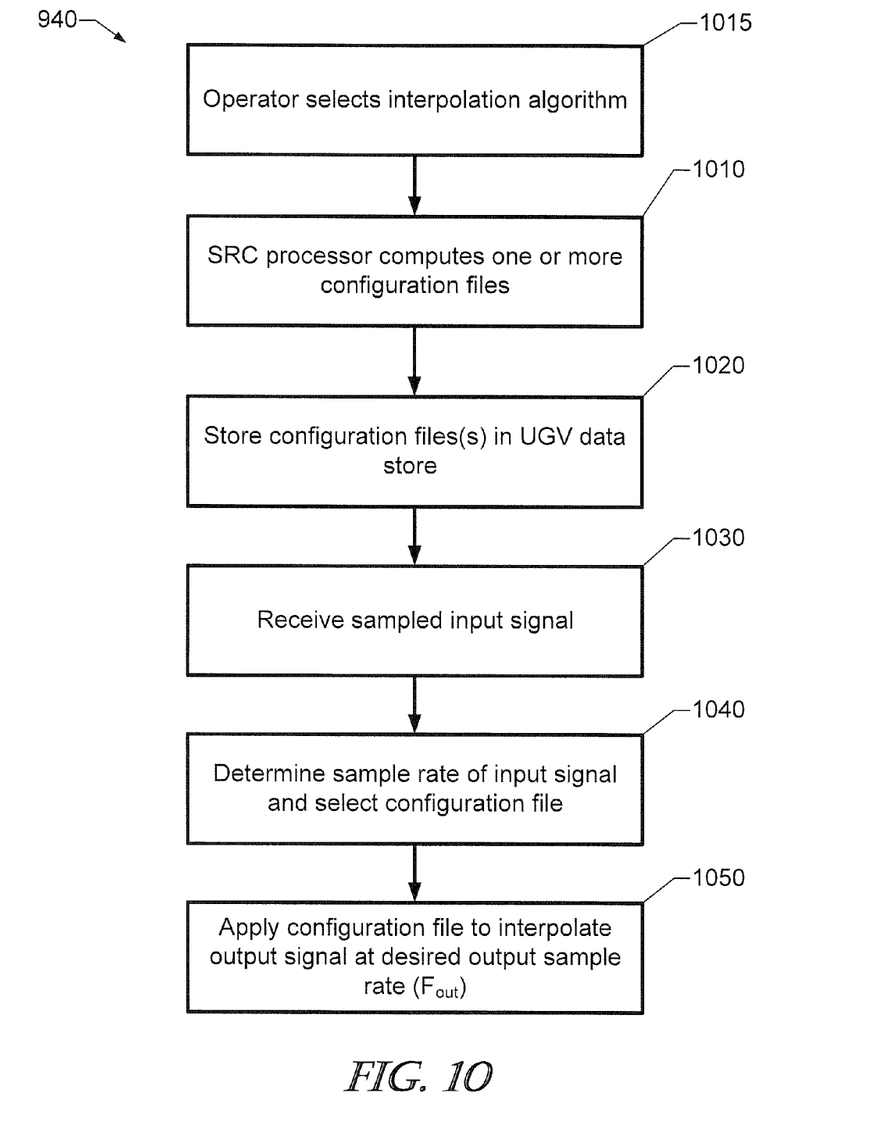
FIG. 10 is a flowchart of the interpolation step 940 of the illustrated in FIG. 9.

FIG. 10 illustrates the operation of step 940 in detail. In some embodiments, the conversion process begins by computing one or more configuration files specific to the first and second sample rates in step 1010. The operator may also select the interpolation algorithm (e.g., but not by way of limitation, sample and hold, two-point linear, quadratic Lagrange, higher order Lagrange, etc.) in step 1015 as an input to step 1010. The configuration file(s) are then stored in the onboard controller of the UGV in step 1020.

In other embodiments, steps 1010, 1015, and 1020 may be performed before the UGV is operational, or at least before remote commanding begins. In such embodiments, step 940 begins with the reception of the input signal, step 1030. The onboard controller of the UGV then determines the input signal sample rate (step 1040) and uses that information to select the proper configuration file. In step 1050, the onboard controller uses the coefficients and other parameters stored in the configuration file to interpolate the output samples at the desired output sample rate.

It should be noted that the order in which the steps of the present method are performed is purely illustrative in nature. In fact, the steps can be performed in any order or in parallel, unless otherwise indicated by the present disclosure.

The method of the present invention may be performed in hardware, software, or any combination thereof, as those terms are currently known in the art. In particular, the present method may be carried out by software, firmware, and/or microcode operating on a computer or computers of any type. Additionally, software embodying the present invention may comprise computer instructions in any form (e.g., source code, object code, and/or interpreted code, etc.) stored in any computer-readable medium (e.g., ROM, RAM, magnetic media, punched tape or card, compact disc (CD), and/or digital versatile disc (DVD), etc.). Furthermore, such software may also be in the form of a computer data signal embodied in a carrier wave, such as that found within the well-known Web pages transferred among devices connected to and with computer networks, such as the Internet. Accordingly, the concepts, systems, and techniques described herein are not limited to any particular platform, unless specifically stated otherwise in the present disclosure.

Figure 11:
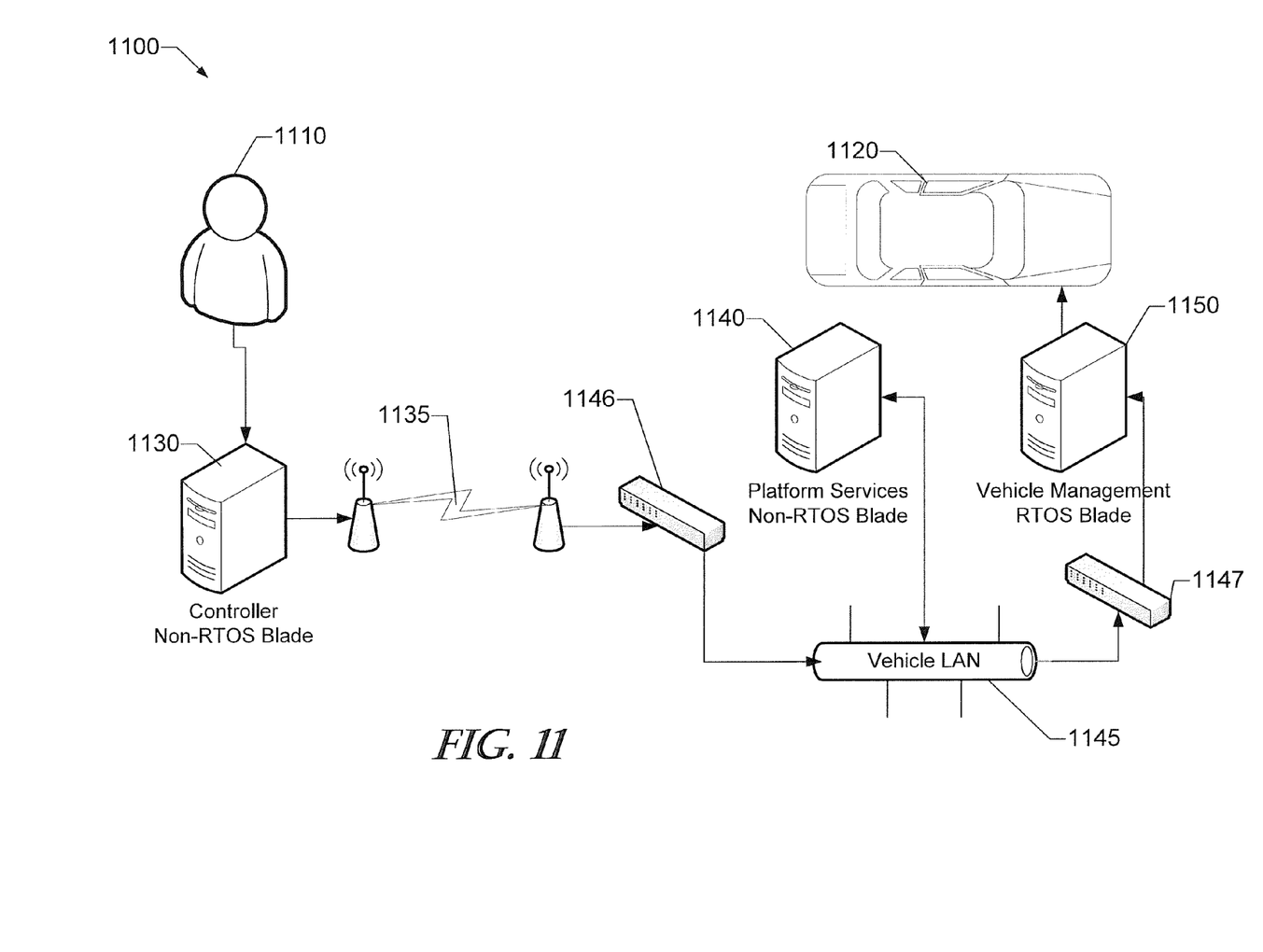
FIG. 11 is a block diagram of a UGV system configured to perform SRC according to one embodiment of the present invention.

For example, the present architecture may be implemented in a UGV system 1100 exemplified by FIG. 11. Here, an operator (or remote driver, in the UGV scenario) 1110 controls the remote device (e.g., a UGV) 1120 using a controller blade 1130 having a non-real time operating system (non-RTOS).

The control signals at rate $F_{in}$ are sent from controller 1130 over the RF link 1135 and routed to a non-RTOS platform services blade 1140. Sample rate conversion (to $F_{out}$) is performed in platform services blade 1140. After conversion, the interpolated samples are routed over vehicle LAN 1145 to vehicle management RTOS blade 1150. In some embodiments, switches 1146 and 1147 may be employed in LAN 1145. Vehicle management RTOS blade 1150 then interfaces with and provides control signals to UGV 1120.

Although both RTOS and non-RTOS blades 1130, 1140, and 1150 are described, those skilled in the art will realize that processors and controllers other than blades can be used and that both real time and non-real time operating systems may be employed in each processor. Accordingly, the concepts, systems, and techniques described herein are not limited to any particular type of processor. Indeed, in some embodiments, each blade 1130, 1140, and/or 1150 may be a personal computer, a workstation, or other stand-alone computer. In other embodiments, each of blades 1130, 1140, and/or 1150 may be implemented in a combination of software and hardware in a distributed computing environment, such as but not limited to a client/server system employing blade servers.

Figure 12:
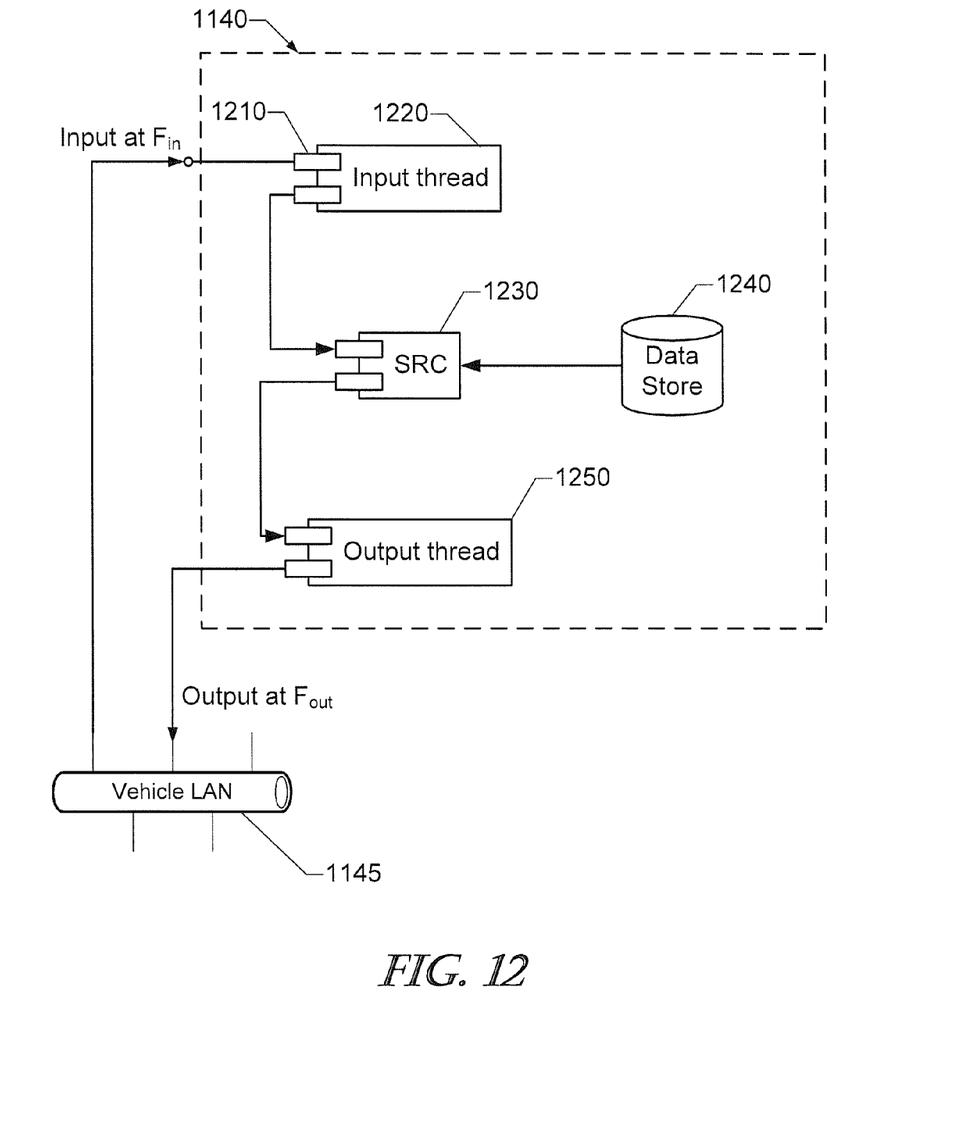
FIG. 12 is a block diagram of a vehicle platform blade (i.e., the SRC processor) according to one embodiment of the present invention.

A portion of the internal architecture of platform services blade 1140, in one exemplary embodiment, is illustrated in FIG. 12. In the context of the UGV example, this implementation may be embodied within blade 1140. However, in the general sense, FIG. 12 illustrates the functions of an SRC processor according to some embodiments of the present invention. Here, the input signal arrives from vehicle LAN 1145 on port 1210 for processing by input facility 1220, which senses rate $F_{in}$.

The input signal is passed to sample rate conversion (SRC) processor 1230, which retrieves and reads the appropriate configuration file (or files) from data store 1240. In some exemplary embodiments, data store 1240 is a memory. Alternatively, data store 1240 may be a storage device, such as but not limited to a hard disk drive, a solid-state drive, a flash drive, or any other type of electronic data storage system known in the art.

Sample rate conversion processor 1230 interpolates the output samples from the input signal and passes the output samples to output facility 1250. Output facility 1250, in turn, sends, forwards, or otherwise communicates the output signal (at $F_{out}$) to vehicle LAN 1145.

Input facility 1220 and output facility 1250 may each be implemented as software threads operating within platform services blade 1140. Alternatively, these facilities may be implemented in hardware within blade 1140 or in a combination of software and hardware, such as but not limited to a digital signal processor and associated microcode or other operational software. Furthermore, the implementation of one facility does not depend on the other. Accordingly, the internal configuration of blade 1140 is not limited to any particular processing architecture, but encompasses all architectures known to those of skill in the relevant arts.

While particular embodiments of the present invention have been shown and described, it will be apparent to those skilled in the art that various changes and modifications in form and details may be made therein without departing from the spirit and scope of the invention as defined by the following claims. Accordingly, the appended claims encompass within their scope all such changes and modifications. Each references cited herein is hereby incorporated herein by reference in its entirety.

We claim:

1. A method for sample rate conversion (SRC) comprising:
    selecting a configuration file from a plurality of candidate configuration files resident in a memory based, at least in part, on an input sample rate and a desired SRC interpolation algorithm, wherein the plurality of candidate configuration files includes configuration files for multiple different SRC interpolation algorithms and multiple different SRC conversion rates, the selected configuration file comprising interpolation coefficients for use in implementing a corresponding SRC interpolation algorithm and a corresponding SRC conversion rate; and
    in an SRC processor, interpolating between input samples using the interpolation coefficients of the selected configuration file to provide a plurality of output samples at an output sample rate, the output samples having a group delay, wherein the interpolation coefficients are adapted to achieve low group delay for the output samples.

2. The method of claim 1, wherein said interpolating employs a Lagrange interpolation.

3. The method of claim 2, wherein said Lagrange interpolation is at least a third order Lagrange interpolation.

4. The method of claim 1, wherein the plurality of candidate configuration files includes at least one configuration file corresponding to a sample and hold interpolation algorithm.

5. The method of claim 1, wherein the plurality of candidate configuration files includes at least one configuration file corresponding to a sample and hold interpolation algorithm and at least one configuration file corresponding to a two-point linear interpolation algorithm.

6. The method of claim 1, wherein the plurality of candidate configuration files includes at least one configuration file corresponding to a sample and hold interpolation algorithm, at least one configuration file corresponding to a two point linear interpolation algorithm, and at least one configuration file corresponding to a quadratic interpolation algorithm.

7. The method of claim 1, further comprising defining the plurality of candidate configuration files prior to knowing the input sample rate.

8. The method of claim 1, wherein selecting the configuration file includes selecting the configuration file based at least in part on the input sample rate, the desired SRC interpolation algorithm, and the output sample rate.

9. An apparatus for sample rate conversion (SRC), comprising:
    an input facility for sensing a sample rate of an input signal;
    a data store having stored therein a plurality of configuration files, said plurality of configuration files having configuration files for multiple different SRC interpolation algorithms and multiple different conversion rates, each configuration file having interpolation coefficients that are configured to implement a corresponding SRC interpolation algorithm and a corresponding conversion rate;

an SRC processor, coupled to said data store, said SRC processor configured to:
  receive the sample rate from said input facility;
  select a configuration file from the data store based at least upon said sample rate; and
  interpolate a plurality of output samples determined by at least said sample rate and said selected configuration file; and an output facility configured to receive, from said SRC processor, said plurality of output samples, said output samples having a group delay, wherein said selected configuration file includes interpolation coefficients adapted to achieve low group delay for said output samples.

10. The apparatus of claim 9, wherein said SRC processor is further configured to interpolate said plurality of output samples using a Lagrange interpolation.

11. The apparatus of claim 10, wherein said Lagrange interpolation is at least a third order Lagrange interpolation.

12. The apparatus of claim 9, wherein the plurality of configuration files includes at least one configuration file corresponding to a sample and hold interpolation algorithm.

13. The apparatus of claim 9, wherein the plurality of configuration files includes at least one configuration file corresponding to a two-point liner interpolation algorithm.

14. The apparatus of claim 9, wherein the plurality of configuration files includes at least one configuration file corresponding to a quadratic interpolation algorithm.

15. The apparatus of claim 9, wherein said plurality of configuration files are defined prior to determining the sample rate of said input signal.

16. The apparatus of claim 9, wherein the SRC processor is configured to select the configuration file based at least in part upon the sample rate of the input signal and an output sample rate.

17. An article comprising at least one non-transitory computer readable medium having instructions stored thereon that, when executed by a computer system, perform a method for use in sample rate conversion (SRC), the method comprising:
  selecting a configuration file from a plurality of configuration files resident in a memory based, at least in part, on an input sample rate and a desired SRC interpolation algorithm, wherein the plurality of candidate configuration files includes configuration files for multiple different SRC interpolation algorithms and multiple different SRC conversion rates, each of said plurality of configuration files comprising interpolation coefficients for use in implementing a corresponding SRC interpolation algorithm and a corresponding SRC conversion rate; and
  interpolating between input samples using said interpolation coefficients of said selected configuration file to provide a plurality of output samples at an output sample rate, said output samples having a group delay, wherein said interpolation coefficients of said selected configuration file are adapted to achieve low group delay for the plurality of output samples.

18. The article of claim 17, wherein said interpolating employs a Lagrange interpolation.

19. The article of claim 18, wherein said Lagrange interpolation is at least a third order Lagrange interpolation.

20. The article of claim 17, wherein the plurality of configuration files includes at least one configuration file corresponding to a sample and hold interpolation algorithm.

21. The article of claim 17, wherein the plurality of configuration files includes at least one configuration file corresponding to a two-point linear interpolation algorithm.

22. The article of claim 17, wherein the plurality of configuration files includes at least one configuration file corresponding to a quadratic interpolation algorithm.

23. The article of claim 17, wherein said plurality of candidate configuration files are defined prior to determining said input sample rate.

24. The article of claim 17, wherein said selecting the stored configuration file is further based upon the output sample rate.

* * * * *